US012813172B2

(12) United States Patent
Wu et al.

(10) Patent No.: US 12,813,172 B2
(45) Date of Patent: Nov. 24, 2026

(54) LOW TEMPERATURE CO-FLOW EPITAXIAL DEPOSITION PROCESS

(71) Applicant: Applied Materials, Inc., Santa Clara, CA (US)

(72) Inventors: Chen-Ying Wu, Santa Clara, CA (US); Abhishek Dube, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 399 days.

(21) Appl. No.: 18/381,331

(22) Filed: Oct. 18, 2023

(65) Prior Publication Data

US 2024/0145240 A1 May 2, 2024

Related U.S. Application Data

(60) Provisional application No. 63/419,359, filed on Oct. 26, 2022.

(51) Int. Cl.
*H01L 21/02* (2006.01)
*C23C 16/08* (2006.01)
(Continued)

(52) U.S. Cl.
CPC .......... *H10P 14/3442* (2026.01); *C23C 16/08* (2013.01); *C23C 16/24* (2013.01);
(Continued)

(58) Field of Classification Search
CPC ........... H01L 21/02576; H01L 21/0262; H01L 21/0245; H01L 21/02532; H01L 21/02639;
(Continued)

(56) References Cited

U.S. PATENT DOCUMENTS 5,731,626 A 3/1998 Eaglesham et al.
6,107,197 A 8/2000 Suzuki
(Continued)

FOREIGN PATENT DOCUMENTS

JP 2022022191 A 2/2022
KR 20170137151 A 12/2017
(Continued)

OTHER PUBLICATIONS

Office Action for Korean Application No. 10-2025-7016339 dated Dec. 1, 2025.
(Continued)

*Primary Examiner* — Herve-Louis Y Assouman
(74) *Attorney, Agent, or Firm* — Patterson + Sheridan, LLP

(57) ABSTRACT

Methods for selectively depositing an epitaxial layer are provided. In some implementations, the selective epitaxial deposition process includes providing the co-flow of chlorosilane precursors with at least one of an antimony-containing precursor and a phosphorous-containing precursor. The method utilizes co-flowing of multiple chlorosilane precursors to enable combination of silicon and at least one of phosphorous and antimony in the same matrix using a low-temperature selective process. The deposited epitaxial layer using the epitaxial deposition techniques described not only contains phosphorous and/or antimony but also has a high activated phosphorous and/or antimony concentration.

20 Claims, 6 Drawing Sheets

(51) Int. Cl.

| | |
|---|---|
| ***C23C 16/24*** | (2006.01) |
| ***C23C 16/40*** | (2006.01) |
| ***C23C 16/46*** | (2006.01) |
| ***C30B 25/16*** | (2006.01) |
| ***C30B 29/06*** | (2006.01) |
| ***H10D 30/01*** | (2025.01) |
| ***H10P 14/20*** | (2026.01) |
| ***H10P 14/24*** | (2026.01) |

(52) U.S. Cl.
CPC ............ *C23C 16/405* (2013.01); *C23C 16/46* (2013.01); *C30B 25/165* (2013.01); *C30B 29/06* (2013.01); *H10D 30/014* (2025.01); *H10P 14/24* (2026.01)

(58) Field of Classification Search
CPC ....... C23C 16/08; C23C 16/24; C23C 16/405; C23C 16/46; C30B 25/165; C30B 29/06; H10D 30/014; H10P 14/3442; H10P 14/24; H10P 14/3211; H10P 14/271; H10P 14/3411
See application file for complete search history.

(56) References Cited

U.S. PATENT DOCUMENTS

| | | | | |
|---|---|---|---|---|
| 6,197,666 | B1 | 3/2001 | Schafer et al. | |
| 6,346,452 | B1 | 2/2002 | Kabir et al. | |
| 6,391,749 | B1 | 5/2002 | Park et al. | |
| 6,869,579 | B2 | 3/2005 | Ohmi et al. | |
| 7,166,528 | B2 | 1/2007 | Kim et al. | |
| 7,435,665 | B2 | 10/2008 | Airaksinen et al. | |
| 7,776,698 | B2 | 8/2010 | Ye et al. | |
| 8,207,023 | B2 | 6/2012 | Ye et al. | |
| 8,394,196 | B2 | 3/2013 | Kim | |
| 8,685,845 | B2 | 4/2014 | Dube et al. | |
| 9,881,790 | B2 | 1/2018 | Dube et al. | |
| 9,923,081 | B1 | 3/2018 | Bao et al. | |
| 10,002,759 | B2 | 6/2018 | Bao et al. | |
| 10,128,110 | B2 | 11/2018 | Dube et al. | |
| 10,177,227 | B1 | 1/2019 | Yoshida et al. | |
| 10,205,002 | B2 | 2/2019 | Bao et al. | |
| 10,256,322 | B2 | 4/2019 | Bao et al. | |
| 10,276,688 | B2 | 4/2019 | Bao et al. | |
| 10,510,620 | B1 * | 12/2019 | Chanemougame .. | H10D 62/121 |
| 2003/0045063 | A1 | 3/2003 | Oda | |
| 2005/0079691 | A1 | 4/2005 | Kim et al. | |
| 2006/0071213 | A1 | 4/2006 | Ma et al. | |
| 2006/0234488 | A1 | 10/2006 | Kim et al. | |
| 2008/0026149 | A1 | 1/2008 | Tomasini et al. | |
| 2008/0079691 | A1 | 4/2008 | Kuboyama et al. | |
| 2008/0102602 | A1 | 5/2008 | Park et al. | |
| 2008/0169512 | A1 | 7/2008 | Doyle et al. | |
| 2008/0182075 | A1 | 7/2008 | Chopra et al. | |
| 2009/0026496 | A1 | 1/2009 | Bauer et al. | |
| 2010/0117154 | A1 | 5/2010 | Ye | |
| 2010/0120235 | A1 | 5/2010 | Huang et al. | |
| 2010/0163997 | A1 | 7/2010 | Drobny et al. | |
| 2010/0224937 | A1 | 9/2010 | Sridhar | |
| 2010/0252862 | A1 | 10/2010 | Ko et al. | |
| 2011/0124169 | A1 | 5/2011 | Ye et al. | |
| 2011/0147828 | A1 | 6/2011 | Murthy et al. | |
| 2013/0089961 | A1 | 4/2013 | Shin et al. | |
| 2013/0210221 | A1 | 8/2013 | Huang et al. | |
| 2013/0320429 | A1 | 12/2013 | Thomas | |
| 2014/0024203 | A1 | 1/2014 | Destefanis et al. | |
| 2014/0084369 | A1 | 3/2014 | Murthy et al. | |
| 2014/0106547 | A1 | 4/2014 | Ye et al. | |
| 2015/0064884 | A1 | 3/2015 | Cheng et al. | |
| 2015/0287826 | A1 | 10/2015 | Cheng et al. | |
| 2016/0240623 | A1 | 8/2016 | Chang et al. | |
| 2016/0300715 | A1 * | 10/2016 | Dube .................. | H10P 14/3442 |
| 2017/0069763 | A1 | 3/2017 | Doris et al. | |
| 2017/0194430 | A1 | 7/2017 | Wood et al. | |
| 2017/0221708 | A1 | 8/2017 | Bergendahl et al. | |
| 2018/0033872 | A1 | 2/2018 | Bao et al. | |
| 2018/0158682 | A1 | 6/2018 | Dube et al. | |
| 2018/0286961 | A1 | 10/2018 | Bao et al. | |
| 2018/0286962 | A1 | 10/2018 | Bao et al. | |
| 2018/0308686 | A1 | 10/2018 | Xie et al. | |
| 2018/0323059 | A1 | 11/2018 | Bhargava et al. | |
| 2018/0358436 | A1 * | 12/2018 | Jambunathan ......... | H10D 62/10 |
| 2019/0122937 | A1 | 4/2019 | Cheng et al. | |
| 2020/0098572 | A1 | 3/2020 | Wang et al. | |
| 2020/0105932 | A1 | 4/2020 | Li et al. | |
| 2020/0399784 | A1 * | 12/2020 | Sanchez .................. | C30B 29/54 |
| 2021/0028280 | A1 | 1/2021 | Liu et al. | |
| 2021/0057539 | A1 | 2/2021 | Chiang et al. | |
| 2021/0126135 | A1 | 4/2021 | Lee et al. | |
| 2021/0391423 | A1 | 12/2021 | Lin et al. | |
| 2022/0052174 | A1 | 2/2022 | Lo | |
| 2022/0115227 | A1 | 4/2022 | Xu | |
| 2022/0238650 | A1 | 7/2022 | Wu et al. | |
| 2022/0278198 | A1 | 9/2022 | Lee et al. | |
| 2022/0301852 | A1 | 9/2022 | Ebata | |

FOREIGN PATENT DOCUMENTS

| | | | |
|---|---|---|---|
| KR | 10-2020-0123856 | A | 10/2020 |
| KR | 20220130001 | A | 9/2022 |
| WO | 2016164152 | A1 | 10/2016 |
| WO | 2017091345 | A1 | 6/2017 |
| WO | 2021144644 | A1 | 7/2021 |

OTHER PUBLICATIONS

International Search Report and Written Opinion for International Application No. PCT/US2023/035441 dated Feb. 7, 2024.

Notice of Reasons for Rejection from JP Application No. 2025-522821 dated Jun. 23, 2026.

* cited by examiner

LOW TEMPERATURE CO-FLOW EPITAXIAL DEPOSITION PROCESS

CROSS-REFERENCE TO RELATED APPLICATIONS

This application claims the benefit of U.S. Provisional Patent Application Ser. No. 63/419,359, filed Oct. 26, 2022, which is incorporated by reference herein in its entirety.

TECHNICAL FIELD

Aspects of the present disclosure generally relate to the field of semiconductor devices and methods for manufacturing semiconductor devices. More particularly, the disclosure relates to selective deposition of epitaxial silicon films.

BACKGROUND

A typical selective epitaxy process involves a deposition reaction and an etch reaction. The deposition reaction causes an epitaxial layer to be formed on monocrystalline surfaces of a substrate and a polycrystalline and/or amorphous layer to be formed on non-monocrystalline surfaces, for example, a patterned dielectric layer deposited atop the substrate. The etch reaction removes the epitaxial layer and the polycrystalline and/or amorphous layer at different rates, providing a net selective process that can result in deposition of an epitaxial material and limited, or no, deposition of polycrystalline material.

As the critical dimensions of devices continue to shrink, methods of selective epitaxial deposition, such as the exemplary method described above, involve lower processing temperatures (e.g., about 600 degrees Celsius or less). Unfortunately, typical etching gases fail to provide a suitable selective window between the epitaxial layer and the polycrystalline and/or amorphous layer at such temperatures. In addition, the current cyclic deposition/etch process is a complex process, which is difficult to maintain and has low throughput.

For the foregoing reasons, there is a need for selective epitaxial processes that can be performed at lower temperatures.

SUMMARY

Aspects of the present disclosure generally relate to the field of semiconductor devices and methods for manufacturing semiconductor devices. More particularly, the disclosure relates to selective deposition of epitaxial silicon films.

In at least one aspect, a method of forming a semiconductor device is provided. The method includes forming a multi-material layer on a substrate positioned in a processing region. The multi-material layer includes a plurality of crystalline first layers and a plurality of non-crystalline second layers arranged in an alternating pattern. The method further includes selectively forming a source region and a drain region on the crystalline first layers of the substrate. The formed source region and drain region contain an n-type dopant precursor concentration of greater than about $1\times10^{21}$ atoms/cm$^3$. Forming the source region and the drain region further includes flowing a first chlorosilane precursor gas selected from dichlorosilane and trichlorosilane; co-flowing a higher order chlorosilane precursor gas having a formula $Cl_ySi_xH_{(2X+2-y)}$, wherein y is 3 or more and x is one or more and the higher order chlorosilane precursor gas is different from the first chlorosilane precursor gas; co-flowing an n-type dopant precursor gas with the first chlorosilane precursor gas and the higher order chlorosilane precursor gas; and heating the substrate to a temperature of about 550° C. or less.

Implementations may include one or more of the following. The higher order chlorosilane precursor gas comprises trichlorosilane ($Cl_3SiH$), hexachlorodisilane ($Si_2Cl_6$), tetrachlorosilane ($SiCl_4$), pentachlorodisilane ($Cl_5Si_2H$), octachlorotrisilane ($Cl_8Si_3$), or a combination thereof. A flow rate of the higher order chlorosilane precursor gas to a flow rate of the first chlorosilane precursor gas is 3:1 or greater. A flow rate of the higher order chlorosilane precursor gas to a flow rate of the first chlorosilane precursor gas is 10:1 or greater. Forming the source region and the drain region further includes maintaining the temperature within the processing region in a range from about 450 degrees Celsius to about 500 degrees Celsius, and a pressure within the processing region is maintained in a range from about 10 Torr to about 600 Torr. The n-type dopant precursor is a phosphorous containing precursor, an antimony precursor, or a combination thereof. The n-type dopant precursor is an antimony-containing precursor and the n-type dopant precursor concentration is an antimony concentration within the source region and the drain region that is greater than about $2\times10^{21}$ atoms/cm$^3$. The antimony-containing precursor is one or a combination of stibine, antimony trichloride, antimony tetrachloride, antimony pentachloride, triphenylantimony, antimony trihydride, antimonytrioxide, antimony pentoxide, antimony trifluoride, antimony tribromide, antimonytriiodide, antimony pentafluoride, triethyl antimony, and trimethyl antimony. The growth rate of the source region and the drain region on the crystalline first layers is greater than about 50 times the growth rate on the non-crystalline second layers. The non-crystalline second layers further comprise dielectric spacers disposed on the outer portion thereof. A plurality of gaps are formed adjacent to the non-crystalline second layers during the selective formation of the source region and the drain region. The method further includes flowing the first chlorosilane precursor at a flow rate in a range from about 100 to about 1,000 sccm; flowing the higher order chlorosilane at a flow rate in a range from about 1,000 to about 10,000 sccm; and flowing the n-type dopant precursor at a flow rate in a range from about 300 to about 1,000 sccm. The method further includes flowing hydrogen gas at a flow rate in a range from about 1 to about 40 SLM.

In another aspect, a method of forming a semiconductor device is provided. The method includes forming a multi-material layer on a substrate positioned in a processing region. The multi-material layer includes a plurality of crystalline first layers and a plurality of non-crystalline second layers arranged in an alternating pattern. The method further includes selectively forming a source region and a drain region on the crystalline first layers of the substrate. The formed source region and drain region contain an n-type dopant precursor concentration of greater than about $2\times10^{21}$ atoms/cm$^3$. Forming the source region and the drain region further includes flowing dichlorosilane; co-flowing trichlorosilane; co-flowing a phosphorous-containing precursor gas with the dichlorosilane and the trichlorosilane; and heating the substrate to a temperature of about 550° C. or less, wherein a ratio of a flow rate of TCS to DCS is in a range from about 3:1 to about 7:1.

Implementations may include one or more of the following. The phosphorous-containing precursor gas is selected from phosphine, trimethylphosphine, dimethylphosphine, triethylphosphine, diethylphosphine, tert-butylphosphine, or a combination thereof. The method further includes flowing the dichlorosilane at a flow rate in a range from about 700 sccm to about 1000 sccm; flowing the trichlorosilane at a flow rate in a range from about 2000 sccm to about 7000 sccm; and flowing phosphine at a flow rate in a range from about 0.1 sccm and 300 sccm. The method further includes flowing an antimony-containing precursor gas at a flow rate in a range from about 10 sccm to about 100 sccm.

In yet another aspect, a method of forming a semiconductor device is provided. The method includes forming a multi-material layer on a substrate positioned in a processing region. The multi-material layer includes a plurality of crystalline first layers and a plurality of non-crystalline second layers arranged in an alternating pattern. The method further includes selectively forming a source region and a drain region on the crystalline first layers of the substrate. The formed source region and drain region contain an n-type dopant precursor concentration of greater than about $1\times10^{21}$ atoms/$cm^3$. Forming the source region and the drain region further includes flowing pentachlorodisilane; co-flowing trichlorosilane; co-flowing an antimony-containing precursor gas with the pentachlorodisilane and the trichlorosilane; and heating the substrate to a temperature of about 550° C. or less, wherein a ratio of a flow rate of trichlorosilane to pentachlorodisilane is in a range from about 9:1 to about 16:1.

Implementations may include one or more of the following. The antimony-containing precursor gas is selected from stibine, antimony trichloride, antimony tetrachloride, antimony pentachloride, triphenylantimony, antimony trihydride, antimonytrioxide, antimony pentoxide, antimony trifluoride, antimony tribromide, antimonytriiodide, antimony pentafluoride, triethyl antimony, and trimethyl antimony. The method further includes flowing the pentachlorodisilane at a flow rate in a range from about 100 sccm to about 1000 sccm; flowing the trichlorosilane at a flow rate in a range from about 7000 sccm to about 10000 sccm; and flowing the antimony-containing precursor at a flow rate in a range from about 0.1 sccm and 100 sccm.

In another aspect, a non-transitory computer readable medium has stored thereon instructions, which, when executed by a processor, causes the processor to perform operations of the above apparatus and/or method.

BRIEF DESCRIPTION OF THE DRAWINGS

So that the manner in which the above-recited features of the present disclosure can be understood in detail, a more particular description of the aspects, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
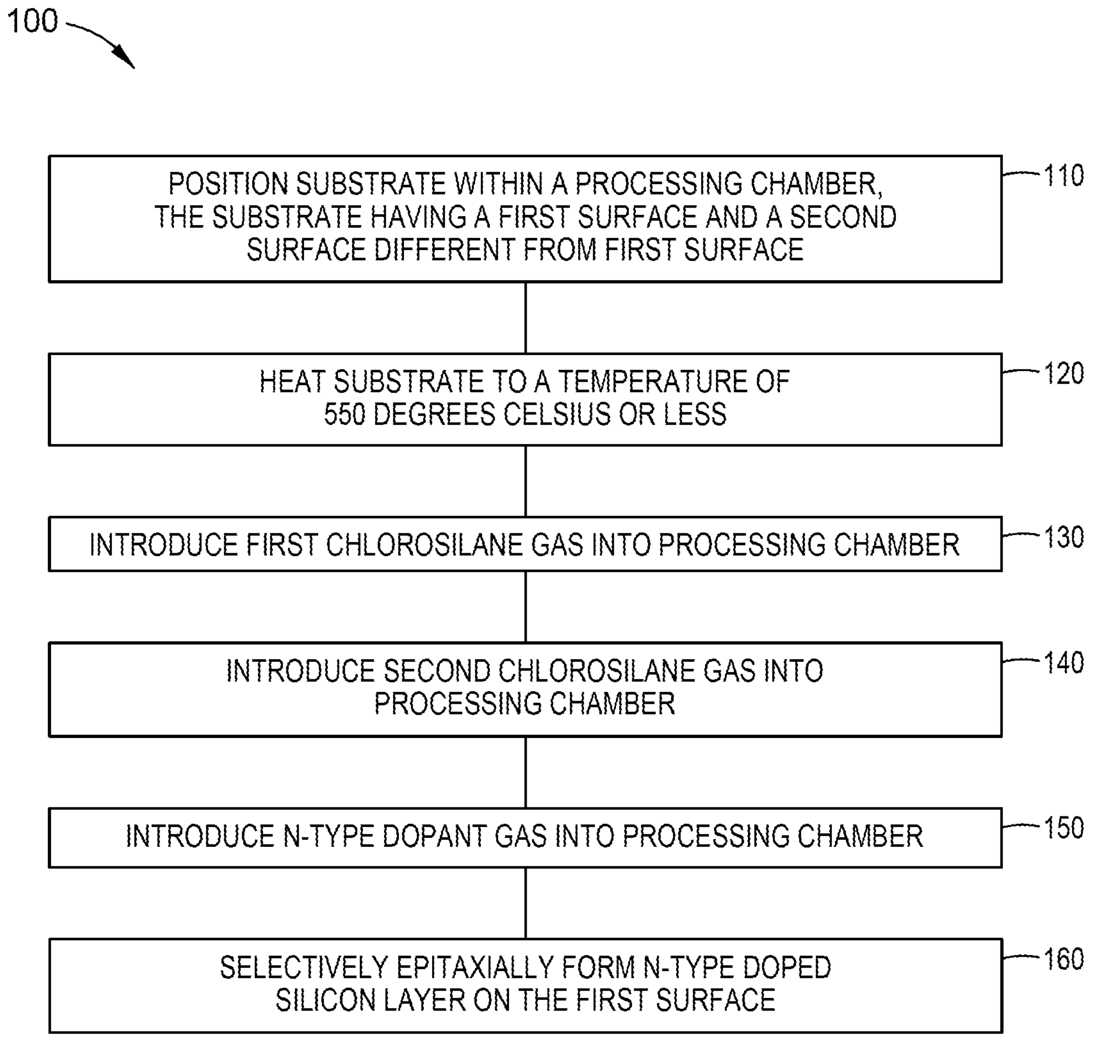
FIG. 1 is a flow chart illustrating a method of forming an epitaxial layer in accordance with one or more aspects of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Aspects of the present disclosure generally relate to the field of semiconductor devices and methods for manufacturing semiconductor devices. More particularly, the disclosure relates to selective deposition of epitaxial silicon films. A method of epitaxial deposition of n-channel metal oxide semiconductor (NMOS) source/drain regions formed in devices, for example, within horizontal gate all around (hGAA) device structures is provided. The method is performed at a temperature of 550 degrees Celsius or less. The method includes the use of a chlorosilane precursor, a higher order chlorosilane precursor, and an n-type dopant precursor selected from an antimony-containing precursor, a phosphorous-containing precursor, an arsenic-containing precursor, or a combination thereof.

Current epitaxial deposition processes have difficulty achieving co-flow selective Si:P or Si:Sb epitaxial deposition at low temperatures (e.g., 550 degrees Celsius or less) because HCl is not active at these low temperatures. As a result, current epitaxial deposition processes are performed using a cyclic deposition/etch process, which is complicated and time consuming leading to throughput issues. Aspects of the present disclosure provide a selective epitaxial deposition process that provides the co-flow of chlorosilane precursors with at least one of an antimony-containing precursor and a phosphorous-containing precursor. Aspects of the present disclosure utilize co-flowing of multiple chlorosilane precursors to enable combination of silicon and at least one of phosphorous and antimony in the same matrix using a low-temperature selective process. The deposited epitaxial layer using the epitaxial deposition techniques described not only contains phosphorous and/or antimony but also has a high activated phosphorous and/or antimony concentration.

The combination of chlorosilane precursors of the present disclosure is utilized to continuously etch the epitaxial layer as it is formed and improves the selectivity of the epitaxial layer as the epitaxial layer is deposited onto a device, for example, a superlattice structure. The epitaxial layer is formed only on the crystalline portions of the superlattice structure and not on oxide or non-crystalline surfaces. The antimony-containing precursor lowers the temperature at which the epitaxial layer is deposited and increases the growth rate of the epitaxial layer on the crystalline portions of the superlattice structure. The phosphorous-containing precursor dopes the epitaxial layer with phosphorous and enables better adhesion to the crystalline portions of the superlattice structure.

It has also been shown that the growth rate of the epitaxial layer with respect to the exposed crystalline surfaces of the superlattice structure changes with the addition of different concentrations of antimony in the epitaxial layer. In some aspects described, the concentration of antimony in the epitaxial layer is greater than about $1.0\times10^{21}$ atoms/$cm^3$ and growth is in primarily the <110> direction. The antimony concentration has been shown to cause the predominant crystal growth in the <110> direction. The crystal growth primarily in the <110> direction reduces faceting of the epitaxial layer on the superlattice structure.

FIG. 1 is a flow chart illustrating a method 100 of forming an epitaxial layer in accordance with one or more aspects of the present disclosure. At operation 110, a substrate, for example the substrate 202, is positioned within a processing chamber. The processing chamber may be a CENTURA® RP Epi chamber available from Applied Materials, Inc., of Santa Clara, California. It is contemplated that other chambers, including those available from other manufacturers, may be used to practice aspects of the disclosure.

The term "substrate" is intended to broadly cover any article or material having a surface onto which a material layer can be deposited. A substrate may include a bulk material such as silicon (e.g., single crystal silicon which may include dopants) or may include one or more layers overlying the bulk material. The substrate may be a planar substrate or a patterned substrate. Patterned substrates are substrates that may include electronic features formed into or onto a processing surface of the substrate. The substrate may contain monocrystalline surfaces and/or one secondary surface that is non-monocrystalline, such as polycrystalline or amorphous surfaces. Monocrystalline surfaces may include the bare crystalline substrate or a deposited single crystal layer usually made from a material such as silicon, germanium, silicon germanium or silicon carbon. Polycrystalline or amorphous surfaces may include dielectric materials, such as oxides or nitrides, specifically silicon oxide or silicon nitride, as well as amorphous silicon surfaces. The substrate may have various dimensions, such as 200 mm, 300 mm, 450 mm, or another diameter, as well as, being a rectangular or square panel. Unless otherwise noted, examples described are conducted on substrates with a 200 mm diameter, a 300 mm diameter, or a 450 mm diameter substrate.

In at least one aspect, the substrate includes a first surface and a second surface different from the first surface. At least one of the first surface and the second surface is monocrystalline and the other surface is non-monocrystalline. Positioning the substrate in the processing chamber may include adjusting one or more reactor conditions, such as temperature, pressure, and/or carrier gas (e.g., Ar, $N_2$, $H_2$, or He) flow rate, to conditions suitable for epitaxial film formation.

At operation 120, the substrate is heated to a temperature of 550 degrees Celsius or less. In at least one aspect, the temperature in the processing chamber may be adjusted so that a reaction region formed at or near an exposed surface of the substrate, or that the surface of the substrate itself, is about 550 degrees Celsius or less, or 500 degrees Celsius or less, or 450 degrees Celsius or less. In one example, the substrate is heated to a temperature in a range from about 400 degrees Celsius to about 550 degrees Celsius, or in a range from about 450 degrees Celsius to about 550 degrees Celsius, or in a range from about 450 degrees Celsius to about 500 degrees Celsius, or in a range from about 400 degrees Celsius to about 500 degrees Celsius. Not to be bound by theory but in some implementations where Si:P is formed, deposition of Si:P at temperatures below 450 degrees Celsius has a very slow growth rate and deposition at temperatures greater than 550 degrees Celsius may affect the thermal budget of other materials formed on the substrate. It is possible to minimize the thermal budget of the final device by heating the substrate to the lowest temperature sufficient to thermally decompose process reagents and epitaxially deposit a layer on the substrate. The pressure in the processing chamber may be adjusted so that the reaction region pressure is within range of about 1 to about 760 Torr, or in a range from about 1 torr to about 600 torr, or in a range from about 100 torr to about 300 torr, or in a range from about 200 torr to about 300 torr. In some implementations, a carrier gas (e.g., nitrogen) may be flowed into the processing chamber at a flow rate of approximately 1 to 40 SLM (standard liters per minute). Nitrogen remains inert during low temperature deposition processes. Therefore, nitrogen is not incorporated into the deposited layer during low temperature processes. Also, a nitrogen carrier gas does not form hydrogen-terminated surfaces as does a hydrogen carrier gas. However, it will be appreciated that in some implementations, a different carrier/diluent gas may be employed, for example, an inert carrier gas such as argon or helium, a different flow rate may be used, or that such gas(es) may be omitted.

At operation 130, a first chlorosilane precursor gas is introduced into the processing chamber. The first chlorosilane precursor gas includes precursors with both silicon and chlorine. In at least one implementation, the first chlorosilane gas includes dichlorosilane ($SiCl_2H_2$) (DCS), trichlorosilane ($SiCl_3H$) (TCS), or a combination thereof. In one example, where dichlorosilane is used, the dichlorosilane is flowed into the processing chamber at a flow rate in a range from about 100 sccm to about 1000 sccm, or in a range from about 700 sccm to about 1000 sccm, or in a range from about 800 sccm to about 950 sccm, or in a range from about 850 sccm to about 900 sccm. In another example, where trichlorosilane is used, the trichlorosilane is flowed into the processing chamber at a flow rate in a range from about 1000 sccm to about 10000 sccm, or in a range from about 7000 sccm to about 10000 sccm, or in a range from about 7500 sccm to about 9000 sccm, or in a range from about 8000 sccm to about 8500 sccm.

At operation 140, a second chlorosilane precursor gas is introduced into the processing chamber. The second chlorosilane precursor gas is different from the first chlorosilane precursor gas. In at least one implementation, the second chlorosilane precursor gas is a higher order chlorosilane gas. The higher order chlorosilane gas may have formula $Cl_ySi_xH_{(2x+2-y)}$ wherein y is 3 or more, or 5 or more, and x is one or more, or two or more, or 3 or more. In one example, y is from 5 to 8 and x is from 2 to 3. In at least one implementation, the second chlorosilane precursor gas comprises, consists of, or essentially consists of trichlorosilane, hexachlorodisilane ($Si_2Cl_6$), tetrachlorosilane ($SiCl_4$), pentachlorodisilane ($Cl_5Si_2H$), octachlorotrisilane (Cl8Si3), or a combination thereof. In another implementation, the second chlorosilane gas comprises, consists of, or essentially consists of pentachlorodisilane ($Cl_5Si_2H$), hexachlorodisilane ($Si_2Cl_6$), octachlorotrisilane ($Cl_8Si_3$), or a combination thereof. In one example, where pentachlorodisilane (PCDS) is used, the pentachlorodisilane is flowed into the processing chamber at a flow rate in a range from about 100 sccm to about 1000 sccm, or in a range from about 300 sccm to about 600 sccm, or in a range from about 400 sccm to about 550 sccm, or in a range from about 450 sccm to about 500 sccm. In another example, where trichlorosilane is used, the trichlorosilane is flowed into the processing chamber at a flow rate in a range from about 1000 sccm to about 10000 sccm, or in a range from about 7000 sccm to about 10000 sccm, or in a range from about 7500 sccm to about 9000 sccm, or in a range from about 8000 sccm to about 8500 sccm.

At operation 150, an n-type dopant precursor is introduced into the processing chamber. In at least one aspect, the n-type dopant precursor comprises, consists of, or essentially consists of a phosphorous containing precursor, an antimony precursor, an arsenic-containing precursor, or a combination thereof. In at least one implementation, the antimony-containing precursor includes one or a combination of stibine, antimony trichloride, antimony tetrachloride, antimony pentachloride, triphenylantimony, antimony trihydride, antimonytrioxide, antimony pentoxide, antimony trifluoride, antimony tribromide, antimonytriiodide, antimony pentafluoride, triethyl antimony, and trimethyl antimony. In at least one particular implementation, triethyl antimony is used. The antimony-containing precursor may have a flow rate in a range from about 0.1 sccm and 300 sccm, or in a range from about 10 sccm to about 100 sccm. In at least one implementation, the phosphorous-containing precursor includes one or a combination of phosphine and alkylphosphines. Suitable alkylphosphines include trimethylphosphine ($(CH_3)_3P$), dimethylphosphine ($(CH_3)_2PH$), triethylphosphine ($(CH_3CH_2)_3P$), tert-butylphosphine, and diethylphosphine ($(CH_3CH_2)_2PH$). In at least one particular implementation, phosphine is used. The phosphorous-containing precursor may have a flow rate in a range from about 0.1 sccm and 1,000 sccm, 0.1 sccm and 300 sccm, or in a range from about 100 sccm to about 300 sccm, or in a range from about 300 to about 1,000 sccm. In at least one implementation, the arsenic-containing precursor includes one or a combination of arsine ($AsH_3$), halogenated arsenic compounds, trimethylarsenic, and silylarsines [$(H_3Si)_{3-x}AsR_x$] where x=0, 1, 2, and $R_x$ is hydrogen or deuterium. The arsenic-containing precursor may have a flow rate in a range from about 0.1 sccm and 1,000 sccm, 0.1 sccm and 300 sccm, or in a range from about 100 sccm to about 300 sccm, or in a range from about 300 to about 1,000 sccm.

It is contemplated that the operation 130, the operation 140, and the operation 150 may occur simultaneously, substantially simultaneously, or in any targeted order. In at least one aspect, each of the first chlorosilane precursor gas, the second chlorosilane precursor gas, the antimony-containing precursor, and the phosphorous-containing precursor are co-flowed into the process chamber simultaneously. Not to be bound by theory but it is believed that co-flowing each of the first chlorosilane precursor gas, the second chlorosilane precursor gas, the antimony-containing precursor, and the phosphorous-containing precursor improves the electrical conductivity of the antimony-doped source/drain regions and enables the deposition temperature to be less than 550 degrees Celsius. In one implementation, at least two of the precursor gases are mixed prior to being delivered to the processing region. In another implementation, at least two of the precursor gases are delivered to the processing region separately and mixed within the processing region.

In at least one implementation, a flow rate of the second chlorosilane precursor gas to a flow rate of the first chlorosilane precursor gas is 3:1 or greater, for example, in a range from about 3:1 to about 7:1. In one example, a flow rate of the second chlorosilane precursor gas to a flow rate of the first chlorosilane precursor gas is 10:1 or greater. In another aspect, a flow rate of the first chlorosilane precursor gas to a flow rate of the second chlorosilane precursor gas is 7:1 or greater, for example, in a range from about 7:1 to about 20:1, or in a range from about 9:1 to about 16:1. In one example, a flow rate of the first chlorosilane precursor gas to a flow rate of the second chlorosilane precursor gas is 10:1 or greater.

In one aspect, the first chlorosilane precursor gas is dichlorosilane, the second chlorosilane precursor gas is trichlorosilane, and the n-type dopant gas is phosphine. The mixture of DCS and TCS includes a mixture of TCS to DCS at a ratio of a flow rate 2:1 or greater, for example, in a range from about 3:1 to about 7:1. In some implementations, TCS has been shown to only grow phosphorous-doped epitaxial layers when DCS is present and does not form the phosphorous-doped epitaxial layers or forms the phosphorous-doped epitaxial layers at a drastically reduced rate when the DCS is not co-flown therewith. DCS has been shown to increase the growth rate of the phosphorous-doped source/drain regions. The chlorosilane precursors enable growth of the phosphorous-doped epitaxial layers. As the phosphorous-doped epitaxial layers are grown, etch back operations are not performed. The chlorine within the chlorosilane precursor gases has been shown to improve the crystalline growth of the epitaxial layer without additional etch back processes. In one example, dichlorosilane is introduced into the processing chamber at a flow rate in a range from about 700 sccm to about 1000 sccm, or in a range from about 800 sccm to about 950 sccm, or in a range from about 850 sccm to about 900 sccm. Trichlorosilane is introduced into the processing chamber at a flow rate in a range from about 1000 sccm to about 10000 sccm, or in a range from about 2000 sccm to about 7000 sccm, or in a range from about 3000 sccm to about 6000 sccm, or in a range from about 3000 sccm to about 4000 sccm. Phosphine is introduced into the processing chamber at a flow rate in a range from about 0.1 sccm and 300 sccm, or in a range from about 100 sccm to about 300 sccm.

In another aspect, the first chlorosilane precursor gas is trichlorosilane (TCS), the second chlorosilane precursor gas is pentachlorodisilane (PCDS), and the n-type dopant gases include triethyl antimony, and optionally phosphine. The mixture of TCS and PCDS includes a mixture of TCS to PCDS at about 7:1 to about 20:1, or in a range from about 9:1 to about 16:1. In some implementations, TCS has been shown to only grow antimony-doped epitaxial layers when PCDS is present and does not form the antimony-doped epitaxial layers or forms the antimony-doped epitaxial layers at a drastically reduced rate when the PCDS is not co-flown therewith. PCDS has been shown to increase the growth rate of the antimony-doped source/drain regions. The chlorosilane precursor gases enable growth of the antimony-doped epitaxial layers. As the antimony-doped epitaxial layers are grown, etch back operations are not performed. The chlorine within the chlorinated silicon precursor has been shown to improve the crystalline growth of the epitaxial layer without additional etch back processes. In one example, PCDS is introduced into the processing chamber at a flow rate in a range from about 100 sccm to about 1000 sccm, or in a range from about 300 sccm to about 600 sccm, or in a range from about 400 sccm to about 550 sccm, or in a range from about 450 sccm to about 500 sccm. Trichlorosilane is introduced into the processing chamber at a flow rate in a range from about 1000 sccm to about 10000 sccm, or in a range from about 7000 sccm to about 10000 sccm, or in a range from about 7500 sccm to about 9000 sccm, or in a range from about 8000 sccm to about 8500 sccm. Triethyl antimony is introduced into the processing chamber at a flow rate in a range from about 0.1 sccm to 100 sccm, or in a range from about 100 sccm to about 300 sccm. Phosphine is introduced into the processing chamber at a flow rate in a range from about 0.1 sccm to 300 sccm, or in a range from about 100 sccm to about 300 sccm.

At operation 160, an n-type doped silicon layer is selectively formed on the first surface. The mixture of the first chlorosilane precursor gas, the second chlorosilane precursor gas, and the one or more n-type dopants are thermally reacted to selectively form the n-type doped silicon layer on the first surface. In one aspect, the n-type doped silicon layer is a phosphorous doped silicon layer having a phosphorous concentration of $2\times10^{21}$ atoms/$cm^3$ or greater, for example, $3.5\times10^{21}$ atoms/$cm^3$, $3.9\times10^{21}$ atoms/$cm^3$, or $4\times10^{21}$ atoms/$cm^3$ or greater. In another aspect, the n-type doped silicon layer is an antimony doped silicon layer having an antimony concentration of $1\times10^{21}$ atoms/$cm^3$ or greater, for example, $1.5\times10^{21}$ atoms/$cm^3$, $2\times10^{21}$ atoms/$cm^3$, or $3\times10^{21}$ atoms/$cm^3$ or greater. In some implementations, the n-type doped silicon layer is then exposed to a thermal treatment process, for example, a spike anneal process. The spike anneal process may be performed at temperatures of about 900° C. to about 1200° C. for a time of about 1 second to about 30 seconds.

Figure 2:
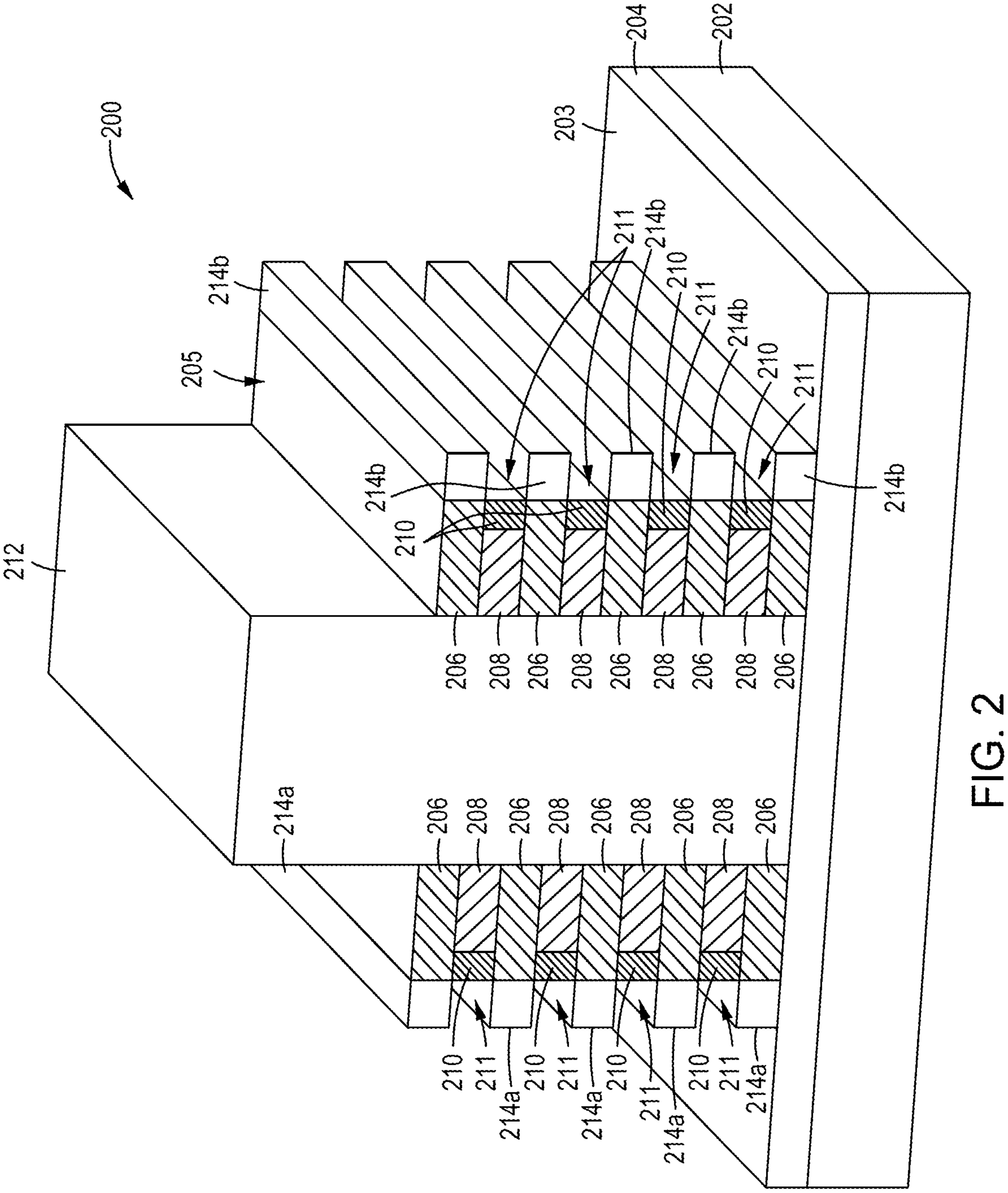
FIG. 2 illustrates a schematic isometric view of a horizontal gate-all-around structure in accordance with one or more aspects of the present disclosure.

FIG. 2 illustrates a schematic isometric view of a horizontal gate-all-around (hGAA) structure 200 in accordance with one or more aspects of the present disclosure. Portions of the hGAA structure 200 may be formed according to the method 100. The hGAA structure 200 includes a multi-material layer 205 having alternating first layers 206 and second layers 208 with a spacer 210 formed therein. The hGAA structure 200 utilizes the multi-material layer 205 as nanowires (e.g., channels) between a source region 214*a* and a drain region 214*b* and a gate structure 212. The composition and formation of the source/drain regions 214*a*, 214*b* on the hGAA structure 200 is described. As shown in the cross-sectional view of the multi-material layer 205 in FIG. 2, the nanowire spacer 210 formed at the bottom (e.g., or an end) of each of the second layers 208 assists in managing the interface between the second layers 208 and the source/drain regions 214*a*, 214*b* so as to reduce parasitic capacitance and maintain minimum device leakage.

The hGAA structure 200 includes the multi-material layer 205 disposed on a top surface 203 of the substrate 202, such as on top of an optional material layer 204 disposed on the substrate 202. In implementations in which the optional material layer 204 is not present, the multi-material layer 205 is directly formed on the substrate 202.

In one example, the optional material layer 204 is an insulating material. Suitable examples of the insulating material may include silicon oxide material, silicon nitride material, silicon oxynitride material, or any suitable insulating materials. Alternatively, the optional material layer 204 may be any suitable materials including conductive material or non-conductive material as needed. The multi-material layer 205 includes at least one pair of layers, each pair comprising the first layer 206 and the second layer 208. Although the example depicted in FIG. 2 shows four pairs and a first layer 206 cap, each pair includes the first layer 206 and the second layer 208 (alternating pairs, each pair comprising the first layer 206 and the second layer 208). An additional first layer 206 is disposed as the top of the multi-material layer 205. The number of pairs may be varied based on different process needs with extra or without extra first layers 206 or second layers 208 being needed. In at least one example, the thickness of each single first layer 206 may be in a range from about 20 Å to about 200 Å, such as about 50 Å, and the thickness of each single second layer 208 may be in a range from about 20 Å and about 200 Å, such as about 50 Å. The multi-material layer 205 may have a total thickness in a range from about 10 Å to about 5000 Å, or in a range from about 40 Å and about 4000 Å.

In at least one implementation, the first layers 206 are crystalline material layers, such as a single crystalline, polycrystalline, or monocrystalline silicon layer. The first layers 206 are formed using an epitaxial deposition process. Alternatively, the first layers 206 are doped silicon layers, including p-type doped silicon layers or n-type doped layers. Suitable p-type dopants include B dopants, Al dopants, Ga dopants, In dopants, or the like. Suitable n-type dopants include N dopants, P dopants, As dopants, Sb dopants, or the like. In yet another example, the first layers 206 are a group III-V material, such as a GaAs layer.

The second layers 208 are non-crystalline material layers. In at least one aspect, the second layers 208 are Ge containing layers, such as SiGe layers, Ge layers, or other suitable layers. Alternatively, the second layers 208 are doped silicon layers, including p-type doped silicon layers or n-type doped layers. In yet another example, the second layers 208 are group III-V materials, such as a GaAs layer. In still another example, the first layers 206 are silicon layers and the second layers 208 are a metal material having a high-k material coating on outer surfaces of the metal material. Suitable examples of the high-k material include hafnium dioxide ($HfO_2$), zirconium dioxide ($ZrO_2$), hafnium silicate oxide ($HfSiO_4$), hafnium aluminum oxide (HfAlO), zirconium silicate oxide ($ZrSiO_4$), tantalum dioxide ($TaO_2$), aluminum oxide, aluminum doped hafnium dioxide, bismuth strontium titanium (BST), or platinum zirconium titanium (PZT), among others. In one particular example, the coating layer is a hafnium dioxide ($HfO_2$) layer. In at least one implementation, the second layers 208 are a similar material to the gate structure 212 to form a wraparound gate around the first layers 206.

The spacers 210 are formed adjacent to the ends of the second layers 208 and may be considered a portion of the second layers 208. The spacers 210 are dielectric spacers or air gaps. The spacers 210 may be formed by etching away a portion of each of the second layers 208 using an etching precursor to form a recess at the ends of each of the second layers 208. The spacers 210 are formed in the recesses adjacent each of the second layers 208. A liner layer (not shown) may additionally be deposited within the recesses before the deposition of the spacers 210. The spacers 210 are formed from a dielectric material and separate each of the nanowires or nanosheets formed as the first layers 206. In at least one implementation, the spacers 210 are selected to be a silicon containing material that may reduce parasitic capacitance between the gate and source/drain structure in the hGAA nanowire structure, such as a low-K material. The silicon containing material or the low-K material may be silicon nitride, silicon oxide, silicon oxynitride, silicon carbide, silicon oxycarbide, silicon carbide nitride, doped silicon layer, or other suitable materials, such as Black Diamond® material available from Applied Materials.

In at least one example, the spacers 210 are a low-k material (e.g., dielectric constant less than 4) or a silicon oxide/silicon nitride/silicon carbide containing material. In another example, the spacers 210 are air gaps.

The gate structure 212 is disposed over and around the multi-material layer 205. The gate structure 212 includes a gate electrode layer and may additionally include a gate dielectric layer, gate spacers, and a mask layer, according to one implementation. The gate electrode layer of the gate structure 212 includes a polysilicon layer or a metal layer that is capped with a polysilicon layer. The gate electrode layer can include metal nitrides (such as titanium nitride (TiN), tantalum nitride (TaN) or molybdenum nitride ($MoN_x$)), metal carbides (such as tantalum carbide (TaC) or hafnium carbide (HfC)), metal-nitride-carbides (such as TaCN), metal oxides (such as molybdenum oxide ($MoO_x$)), metal oxynitrides (such as molybdenum oxynitride ($MoO_xN_y$)), metal silicides (such as nickel silicide), or a combination thereof. The gate electrode layer is disposed on top of and around the multi-material layer 205.

A gate dielectric layer may optionally be disposed below the gate electrode layer and below the multi-material layer 205. The optional gate dielectric layer can include silicon oxide ($SiO_x$), which can be formed by a thermal oxidation of one or more of the first layers 206 or and/or the second layers 208, or by any suitable deposition process. Suitable materials for forming the gate dielectric layer include silicon oxide, silicon nitrides, oxynitrides, metal oxides such as hafnium oxide ($HfO_2$), hafnium zirconium oxide ($HfZrO_x$), hafnium silicon oxide ($HfSiO_x$), hafnium titanium oxide ($HfTiO_x$), hafnium aluminum oxide ($HfAlO_x$), and combinations and multi-layers thereof. Gate spacers are formed on sidewalls of the gate electrode layer. Each gate spacer includes a nitride portion and/or an oxide portion. A mask layer is formed on top of the gate electrode layer and can include silicon nitride.

Figure 4:
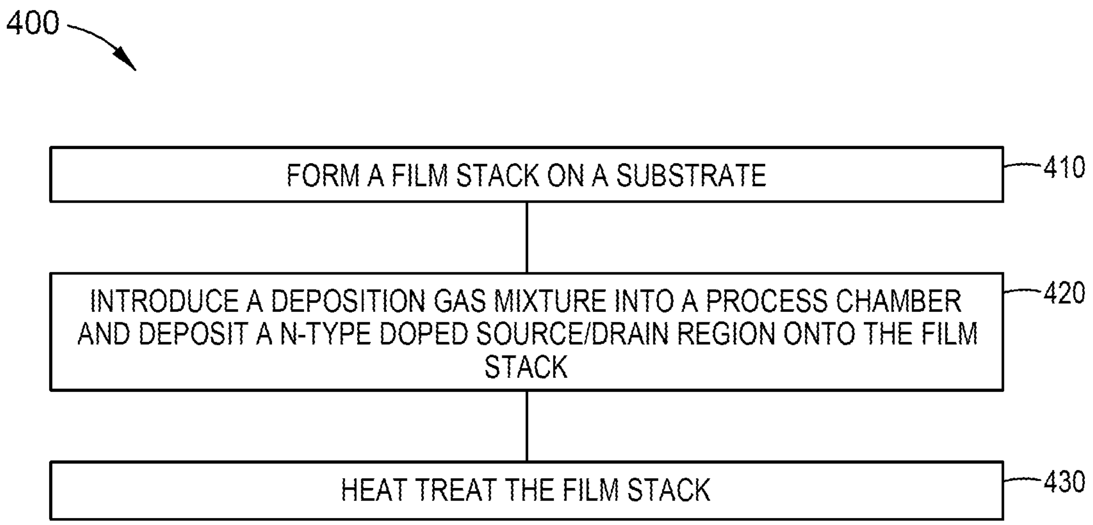
FIG. 4 is a flow chart illustrating another method of forming an epitaxial layer in accordance with one or more aspects of the present disclosure.

The hGAA structure 200 is formed using the method 400 of FIG. 4. The hGAA structure 200 described is an n-channel metal oxide semiconductor (NMOS) device. Therefore, the dopants within the hGAA structure 200 are n-type dopants, such as phosphorus, antimony, or a combination thereof. In at least one implementation, the n-type dopant includes phosphorous (P). In at least another implementation, the n-type dopant includes antimony (Sb). In yet another implementation, the n-type dopant includes both phosphorous (P) and antimony (Sb).

Figure 3A:
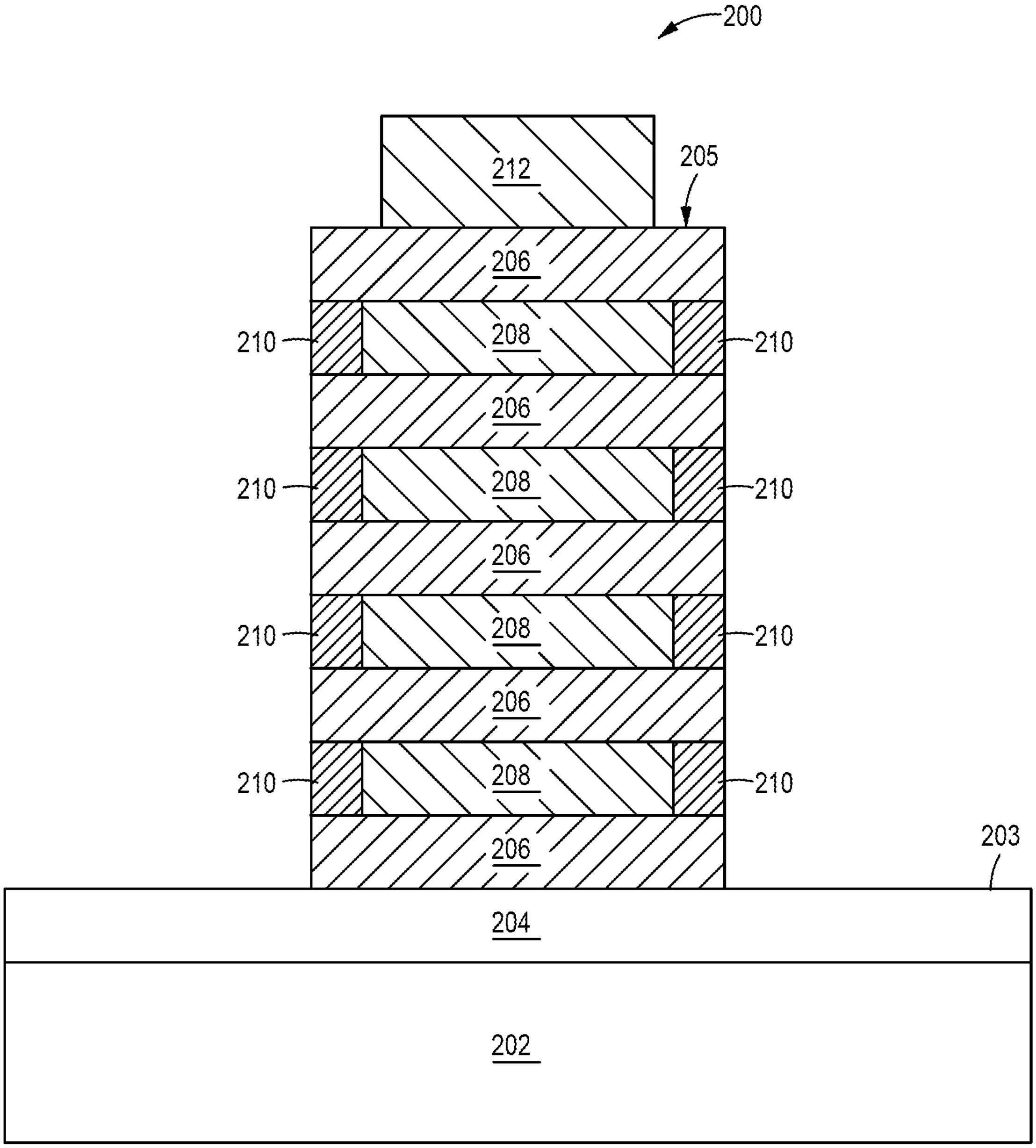
FIGS. 3A-3C illustrate a schematic cross-sectional view of the hGAA structure of FIG. 2 in accordance with one or more aspects of the present disclosure.

The multi-material layer 205 and the gate structure 212 described with respect to FIG. 2 are formed on the substrate 202 and the optional material layer 204 during operation 410. After operation 410, the hGAA structure 200 is similar to the structure shown in FIG. 3A. The combination of the multi-material layer 205 and the gate structure 212 may be described as a film-stack. During operation 410, the multi-material layer 205 is formed using a plurality of deposition operations to form a plurality of alternating first layers 206 and second layers 208. A portion of the second layers 208 is etched back and the spacers 210 are formed.

The gate structure 212 is formed around the multi-material layer 205. In at least one implementation, the gate electrode layer of the gate structure 212 is a similar material to the material of each of the second layers 208 within the multi-material layer 205. The gate structure 212 and the second layers 208 form a wrap-around gate around each of the first layers 206. The first layers 206 act as nanowires or nanosheets disposed within the wrap-around gate. The first layers 206 serve as a channel between source/drain regions after the formation of the source/drain regions.

Figure 3B:
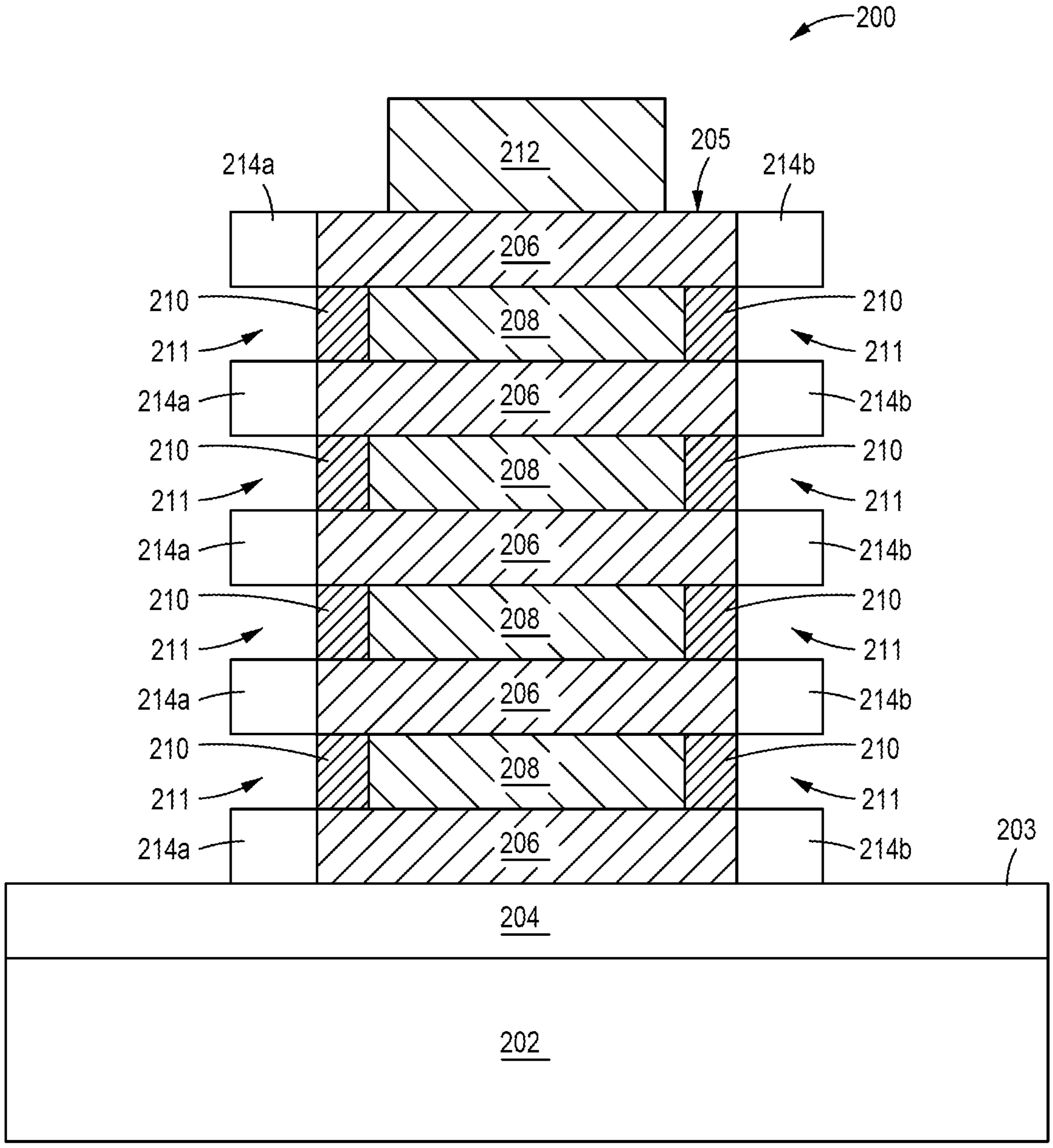

After the formation of the film-stack during operation 410, the n-type doped source/drain regions 214*a*, 214*b* are formed during operation 420 as shown in FIG. 3B. The n-type doped source/drain regions 214*a*, 214*b* formed during operation 420 may be formed according to the method 100. During operation 420, a deposition gas mixture is introduced into the process chamber to deposit the n-type doped source/drain regions 214*a*, 214*b*. The n-type doped source/drain regions 214*a*, 214*b* are deposited on the substrate 202 and each of the first layers 206 within the multi-material layer 205 as shown in FIG. 3B. In at least one implementation, the n-type doped source/drain regions 214*a*, 214*b* have a thickness ranging from about 1 nm to about 10 nm. The n-type doped source/drain regions 214*a*, 214*b* are deposited by an epitaxial deposition process, such as a selective epitaxial deposition process as described in the method 100. In at least one implementation, the n-type doped source/drain regions 214*a*, 214*b* are selectively deposited on the first layers 206 and exposed portions of the substrate 202, which are fabricated from a crystalline material, such as Si, and the n-type doped source/drain regions 214*a*, 214*b* are not deposited on the gate structure 212 or the spacers 210, which are fabricated from a dielectric material.

In at least one implementation, the deposition gas mixture includes a first chlorosilane precursor, a second chlorosilane precursor, and an n-type dopant as described.

The amount of excessive point defects in the n-type doped source/drain regions 214*a*, 214*b* can be controlled by varying processing conditions, such as partial pressure of the precursors, ratio of the precursors, processing temperature, and/or layer thickness. The amount of excessive point defects in the n-type doped source/drain regions 214*a*, 214*b* can control diffusion of the antimony atoms into the first layers 206 of the multi-material layer 205. During the deposition of the n-type doped source/drain regions 214*a*, 214*b*, Sb atoms can be diffused into the first layers 206 of the multi-material layer 205. P-dopants are added to the n-type doped source/drain regions 214*a*, 214*b* using a P-containing precursor. The P-containing precursor is flown simultaneously to both the chlorosilane-containing precursor and the antimony-containing precursor.

Each of the first chlorosilane containing precursor gas, the second chlorosilane containing precursor gas, and the n-type containing precursor are co-flowed into the process chamber simultaneously. Co-flowing each of the first chlorosilane containing precursor gas, the second chlorosilane containing precursor gas, and the n-type containing precursor gas improves the electrical conductivity of the antimony and/or phosphorous-doped source/drain regions 214*a*, 214*b* and enables the deposition temperature to be less than 550 degrees Celsius. In some implementations, the phosphorous-containing precursor is a generic n-type dopant precursor. In one example described, the ratio of first chlorosilane precursor gas to the second chlorosilane precursor gas to the n-type dopant precursor gas (e.g., phosphorous) flown into the process chamber is about 3:1:0.1 to about 7:1:0.3 for TCS/DCS/PH3. In another example described, the ratio of first chlorosilane precursor gas to the second chlorosilane precursor gas to the n-type dopant precursor gas (e.g., antimony) flown into the process chamber is about 7:1:0.1 to about 20:1:1, or is about 9:1:0.1 to 16:1:0.1 for TCS/PCDS/TeSb. In yet another example described, the ratio of first chlorosilane precursor gas to the second chlorosilane precursor gas to the n-type dopant precursor gas (e.g., antimony) flown into the process chamber is about 3:1:0.1:0.1 to about 7:1:0.3:0.3 for TCS/PCDS/TeSb/PH3.

In one example, the n-type doped source/drain regions 214*a*, 214*b* have a phosphorous concentration of $2.0\times10^{21}$ atoms/$cm^3$ or greater, for example, $3.5\times10^{21}$ atoms/$cm^3$, $3.9\times10^{21}$ atoms/$cm^3$, or $4.0\times10^{21}$ atoms/$cm^3$ or greater. In another example, the n-type doped source/drain regions 214*a*, 214*b* have an antimony concentration of $1.0\times10^{21}$ atoms/$cm^3$ or greater, for example, $1.5\times10^{21}$ atoms/$cm^3$, $2.0\times10^{21}$ atoms/$cm^3$, or $3.0\times10^{21}$ atoms/$cm^3$ or greater. In yet another example, the n-type doped source/drain regions 214*a*, 214*b* have an antimony concentration of 1.0×10^21 atoms/cm^3 or greater, for example, 1.5×10^21 atoms/cm^3, 2.0×10^21 atoms/cm^3, or 3.0×10^21 atoms/cm^3 or greater. The phosphorous-dopant concentration within the deposited n-type doped source/drain regions 214*a*, 214*b* is about 2.0×10^21 atoms/cm^3 to about 4.0×10^21 atoms/cm^3. The low temperature deposition of the n-type doped source/drain regions 214*a*, 214*b* further decreases the migration of the antimony into other portions of the multi-material layer 205 and the substrate as the antimony diffusion may cause degradation of device performance.

The concentration of the antimony-dopant within the n-type doped source/drain regions 214*a*, 214*b* alters the growth rate of the n-type doped source/drain regions 214*a*, 214*b*. It has been found that with lower concentrations of antimony-dopant or in implementations without co-flow of the antimony-dopant, the deposition rate of the n-type doped source/drain regions 214*a*, 214*b* at temperatures less than 550 degrees Celsius is greatly reduced. In some implementations, the concentration of the antimony within the n-type doped source/drain regions 214*a*, 214*b* has been found to increase deposition rates by over twice the growth rate compared to processes without any antimony-containing precursor. In some implementations, the growth rate of the n-type doped source/drain regions 214*a*, 214*b* is near zero on both crystalline and non-crystalline locations of the substrate at temperatures less than 550 degrees Celsius without the simultaneous co-flow of both the antimony-containing precursor and the chlorosilane precursors. The antimony within the antimony-containing precursor acts to lower the surface activation energy of the first layers 206, so that the n-type doped source/drain regions 214*a*, 214*b* are formed. The growth rate of the n-type doped source/drain regions 214*a*, 214*b* is highly selective to crystalline structures, such that the growth rate of the n-type doped source/drain regions 214*a*, 214*b* on the first layers 206 is greater than about 100× the growth rate of the n-type doped source/drain regions 214*a*, 214*b* on the spacers 210 and the gate structure 212, such as greater than about 150× the growth rate. In some implementations, the growth rate of the n-type doped source/drain regions 214*a*, 214*b* is about 10 angstroms/minute to about 20 angstroms/minute.

In some implementations, the deposition of the n-type doped source/drain regions 214*a*, 214*b* with antimony is performed in a first processing chamber and the doping of the n-type doped source/drain regions 214*a*, 214*b* with phosphorous is performed in a second processing chamber. In yet other implementations, the formation of the n-type doped source/drain regions 214*a*, 214*b* with antimony and the doping of the n-type doped source/drain regions 214*a*, 214*b* with phosphorous are performed in one chamber.

Figure 3C:
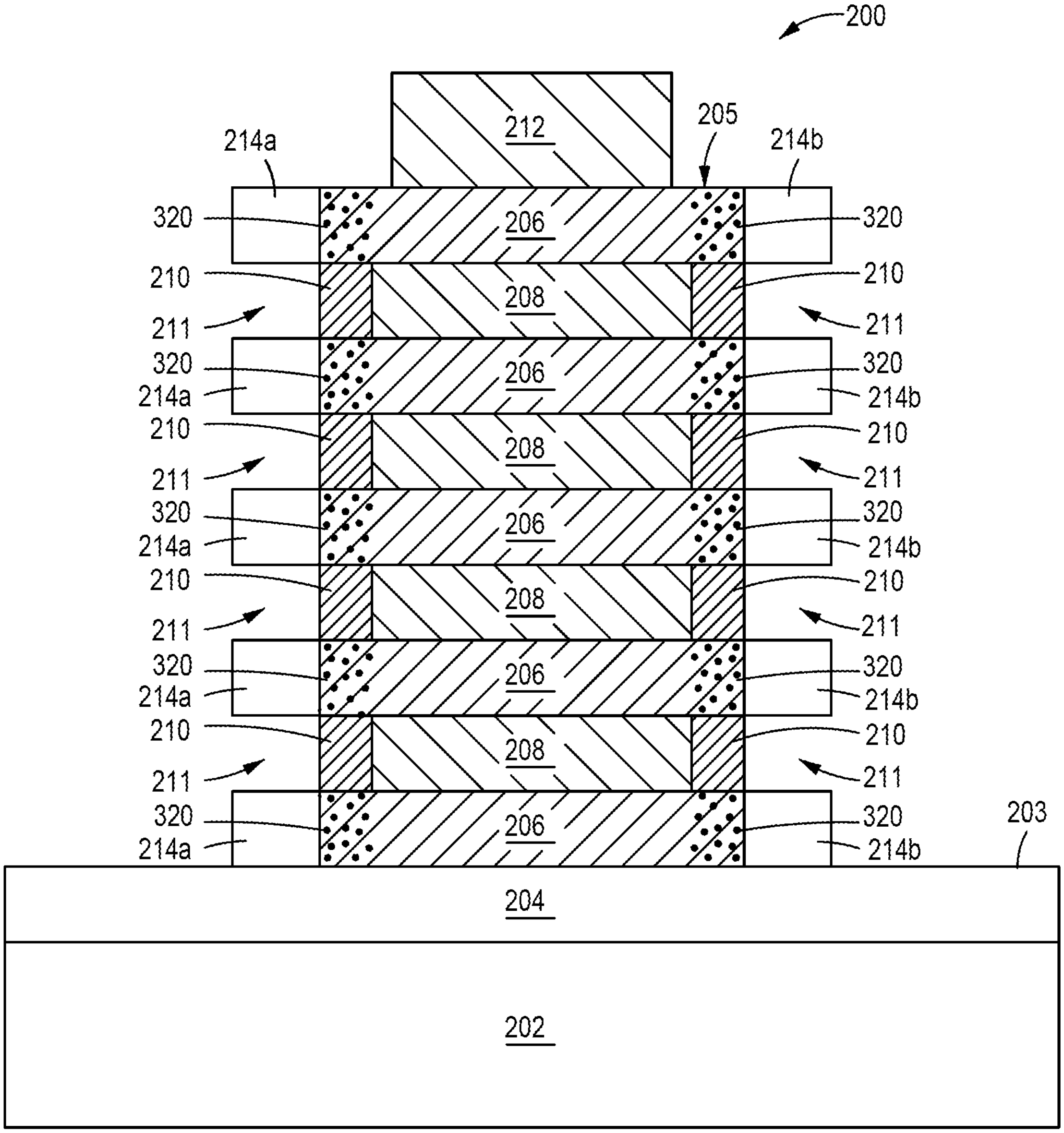

After operation 420, operation 430 of thermally treating the hGAA structure 200 is performed. In at least one implementation, thermal treatment of the hGAA structure is a spike anneal process. The spike anneal process is performed at temperatures of about 900° C. to about 1200° C. for a time of about 1 second to about 30 seconds. Due to the large size of the Sb atoms, the Sb atoms do not diffuse at the same rate as the P dopant. The short time period of the spike anneal thus suppresses Sb atom diffusion, while allowing some P dopant to diffuse in the first layers 206 to form a doped region 320 of the first layers 206 of the multi-material layer 205 as shown in FIG. 3C.

As the temperature of operation 420 and operation 430 is kept below about 550° C., the diffusion of dopants and warpage of the multi-material layer 205 is reduced.

A capping layer (not shown) may be optionally deposited over the hGAA structure 200 after the formation of the n-type doped source/drain regions 214*a*, 214*b*. The capping layer is a silicon-containing layer and is deposited on top of each of the n-type doped source/drain regions 214*a*, 214*b* and the spacers 210, such that the capping layer fills the gaps 211.

EXAMPLES

The following non-limiting examples are provided to further illustrate implementations described. However, the examples are not intended to be all-inclusive and are not intended to limit the scope of the embodiments described.

The examples were performed on a wafer with exposed crystalline silicon layer wafer having a patterned silicon nitride layer deposited on the exposed crystalline silicon layer. The patterned silicon nitride layer exposes trenches formed in the crystalline silicon.

Si:P Examples

TABLE I

| Temp (° C.) | Pressure (Torr) | Time | DCS (sccm) | TCS (sccm) | PH3 (sccm) | H2 (SLM) | Thickness (Å) | Growth Rate (Å/min) | Resis. (m-Ω-cm) | Est[P] (at/cm$^3$) | Equ. [C] | Haze (ppm) |
|---|---|---|---|---|---|---|---|---|---|---|---|---|
| 550 | 300 | | 900 | 6000 | 300 | 3 | 187 | 7.5 | 0.57 | 4.3E+21 | 1.92% | 0.35 |
| 500 | 300 | | 1000 | 3000 | 100 | | 192 | 3.2 | 0.49 | 3.9E+21 | 1.77% | |
| 480 | 300 | | 1000 | 3000 | 100 | 0 | 196 | 2.73 | | 4.3E+21 | 1.92 | |

Si:Sb:P Examples

TABLE II

| Temp (° C.) | Pressure (Torr) | Time | DCS (sccm) | TCS (sccm) | PH3 (sccm) | H2 (SLM) | TeSb (sccm) | Thickness (Å) | Growth Rate (Å/min) | Resis. (m-Ω-cm) | Est[P] (at/cm$^3$) | Equ. [C] |
|---|---|---|---|---|---|---|---|---|---|---|---|---|
| 500 | 300 | | 1000 | 3000 | 100 | | 60 | 125 | 1.78 | | | 1.76% |

Si:Sb Examples

TABLE III

| Temp (° C.) | Pressure (Torr) | Time | TCS (sccm) | PCDS (sccm) | TeSb (sccm) | Thickness (Å) | Equ Ge % | Est[Sb] (at/cm$^3$) | Growth Rate (Å/min) | Haze | Resis (m-Ω-cm) |
|---|---|---|---|---|---|---|---|---|---|---|---|
| 500 | 300 | 600 | 8000 | 500 | 60 | 281 | 17.9 | 3.1E+21 | 28.1 | NA | 1.58 |
| 500 | 150 | 750 | 8000 | 500 | 60 | 203 | 10.7 | 1.9E+21 | 16.24 | 3.5 | 0.75 |
| 500 | 80 | 750 | 8000 | 500 | 60 | 187 | 13 | 1.9E+21 | 10.4 | 2.34 | 0.74 |

In the Summary and in the Detailed Description, and the Claims, and in the accompanying drawings, reference is made to particular features (including method operations) of the present disclosure. It is to be understood that the disclosure in this specification includes all possible combinations of such particular features. For example, where a particular feature is disclosed in the context of a particular aspect, implementation, or example of the present disclosure, or a particular claim, that feature can also be used, to the extent possible in combination with and/or in the context of other particular aspects and implementations of the present disclosure, and in the present disclosure generally.

The term "comprises" and grammatical equivalents thereof are used to mean that other components, ingredients, operations, etc. are optionally present. For example, an article "comprising" (or "which comprises") components A, B, and C can consist of (i.e., contain only) components A, B, and C, or can contain not only components A, B, and C but also one or more other components. In addition, whenever a composition, an element or a group of elements is preceded with the transitional phrase "comprising" and grammatical equivalents thereof, it is understood that it is contemplated that the same composition or group of elements may be preceded with transitional phrases "consisting essentially of," "consisting of," "selected from the group of consisting of," or "is" preceding the recitation of the composition, element, or elements and vice versa.

Where reference is made to a method comprising two or more defined operations, the defined operations can be carried out in any order or simultaneously (except where the context excludes that possibility), and the method can include one or more other operations which are carried out before any of the defined operations, between two of the defined operations, or after all of the defined operations (except where the context excludes that possibility).

When introducing elements of the present disclosure or exemplary aspects or embodiment(s) thereof, the articles "a," "an," "the" and "said" are intended to mean that there are one or more of the elements.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a semiconductor device comprising:

forming a multi-material layer on a substrate positioned in a processing region, wherein the multi-material layer includes a plurality of crystalline first layers and a plurality of non-crystalline second layers arranged in an alternating pattern; and selectively forming a source region and a drain region on the crystalline first layers of the substrate, wherein the formed source region and drain region contain an n-type dopant precursor concentration of greater than about $1\times10^{21}$ atoms/cm$^3$, the forming the source region and the drain region further comprising:

flowing a first chlorosilane precursor gas selected from dichlorosilane and trichlorosilane;

co-flowing a higher order chlorosilane precursor gas having a formula $Cl_ySi_xH_{(2X+2-y)}$, wherein y is 3 or more and x is one or more and the higher order chlorosilane precursor gas is different from the first chlorosilane precursor gas;

co-flowing an n-type dopant precursor gas with the first chlorosilane precursor gas and the higher order chlorosilane precursor gas; and heating the substrate to a temperature of about 550° C. or less, wherein the growth rate of the source region and the drain region on the crystalline first layers is greater than about 50 times the growth rate on the non-crystalline second layers.

2. The method of claim 1, wherein the higher order chlorosilane precursor gas comprises trichlorosilane (Cl3SiH), hexachlorodisilane (Si2Cl6), tetrachlorosilane (SiCl4), pentachlorodisilane (Cl5Si2H), octachlorotrisilane (Cl8Si3), or a combination thereof.

3. The method of claim 1, wherein a flow rate of the higher order chlorosilane precursor gas to a flow rate of the first chlorosilane precursor gas is 3:1 or greater.

4. The method of claim 3, wherein a flow rate of the higher order chlorosilane precursor gas to a flow rate of the first chlorosilane precursor gas is 10:1 or greater.

5. The method of claim 3, wherein the forming the source region and the drain region further comprises maintaining the temperature within the processing region in a range from about 450 degrees Celsius to about 500 degrees Celsius, and a pressure within the processing region is maintained in a range from about 10 Torr to about 600 Torr.

6. The method of claim 1, wherein the n-type dopant precursor is a phosphorous containing precursor, an antimony precursor, or a combination thereof.

7. The method of claim 1, wherein the n-type dopant precursor is an antimony-containing precursor and the n-type dopant precursor concentration is an antimony concentration within the source region and the drain region that is greater than about $2\times10^{21}$ atoms/cm$^3$.

8. The method of claim 7, wherein the antimony-containing precursor is one or a combination of stibine, antimony trichloride, antimony tetrachloride, antimony pentachloride, triphenylantimony, antimony trihydride, antimonytrioxide, antimony pentoxide, antimony trifluoride, antimony tribromide, antimonytriiodide, antimony pentafluoride, triethyl antimony, and trimethyl antimony.

9. The method of claim 1, wherein the non-crystalline second layers further comprise dielectric spacers disposed on the outer portion thereof.

10. The method of claim 9, wherein a plurality of gaps are formed adjacent to the non-crystalline second layers during the selective formation of the source region and the drain region.

11. A method of forming a semiconductor device, comprising:

forming a multi-material layer on a substrate positioned in a processing region, wherein the multi-material layer includes a plurality of crystalline first layers and a plurality of non-crystalline second layers arranged in an alternating pattern; and selectively forming a source region and a drain region on the crystalline first layers of the substrate, wherein the formed source region and drain region contain an n-type dopant precursor concentration of greater than about $1\times10^{21}$ atoms/$cm^3$, the forming the source region and the drain region further comprising:

flowing a first chlorosilane precursor gas selected from dichlorosilane and trichlorosilane, wherein the first chlorosilane precursor gas is flowed at a flow rate in a range from about 100 to about 1,000 sccm;

co-flowing a higher order chlorosilane precursor gas having a formula $Cl_ySi_xH_{(2X+2-y)}$, wherein y is 3 or more and x is one or more, the higher order chlorosilane precursor gas is different from the first chlorosilane precursor gas, and the higher order chlorosilane precursor gas is flowed at a flow rate in a range from about 1,000 to about 10,000 sccm;

co-flowing an n-type dopant precursor gas with the first chlorosilane precursor gas and the higher order chlorosilane precursor gas, wherein the n-type dopant precursor gas is flowed at a flow rate in a range from about 300 to about 1,000 sccm; and heating the substrate to a temperature of about 550° C. or less, wherein a flow rate of the higher order chlorosilane precursor gas to a flow rate of the first chlorosilane precursor gas is 3:1 or greater.

12. The method of claim 11, further comprising flowing hydrogen gas at a flow rate in a range from about 1 to about 40 SLM.

13. A method of forming a semiconductor device comprising:

forming a multi-material layer on a substrate positioned in a processing region, wherein the multi-material layer includes a plurality of crystalline first layers and a plurality of non-crystalline second layers arranged in an alternating pattern; and selectively forming a source region and a drain region on the crystalline first layers of the substrate, wherein the formed source region and drain region contain an n-type dopant precursor concentration of greater than about $2\times10^{21}$ atoms/$cm^3$, the forming the source region and the drain region further comprising:

flowing dichlorosilane at a flow rate in a range from about 700 sccm to about 1000 sccm;

co-flowing trichlorosilane at a flow rate in a range from about 2000 sccm to about 7000 sccm;

co-flowing a phosphorous-containing precursor gas with the dichlorosilane and the trichlorosilane, the phosphorous-containing precursor gas being flowed at a flow rate in a range from about 0.1 sccm to about 300 sccm; and heating the substrate to a temperature of about 550° C. or less, wherein a ratio of a flow rate of TCS to DCS is in a range from about 3:1 to about 7:1.

14. The method of claim 13, wherein the phosphorous-containing precursor gas is selected from phosphine, trimethylphosphine, dimethylphosphine, triethylphosphine, diethylphosphine, tert-butylphosphine, or a combination thereof.

15. The method of claim 13, wherein the phosphorous-containing precursor gas is phosphine.

16. The method of claim 15, further comprising flowing an antimony-containing precursor gas at a flow rate in a range from about 10 sccm to about 100 sccm.

17. A method of forming a semiconductor device comprising:

forming a multi-material layer on a substrate positioned in a processing region, wherein the multi-material layer includes a plurality of crystalline first layers and a plurality of non-crystalline second layers arranged in an alternating pattern; and selectively forming a source region and a drain region on the crystalline first layers of the substrate, wherein the formed source region and drain region contain an n-type dopant precursor concentration of greater than about $1\times10^{21}$ atoms/$cm^3$, the forming the source region and the drain region further comprising:

flowing pentachlorodisilane;

co-flowing trichlorosilane;

co-flowing an antimony-containing precursor gas with the pentachlorodisilane and the trichlorosilane; and heating the substrate to a temperature of about 550° C. or less, wherein a ratio of a flow rate of trichlorosilane to pentachlorodisilane is in a range from about 9:1 to about 16:1.

18. The method of claim 17, wherein the antimony-containing precursor gas is selected from stibine, antimony trichloride, antimony tetrachloride, antimony pentachloride, triphenylantimony, antimony trihydride, antimonytrioxide, antimony pentoxide, antimony trifluoride, antimony tribromide, antimonytriiodide, antimony pentafluoride, triethyl antimony, and trimethyl antimony.

19. The method of claim 17, further comprising:

flowing the pentachlorodisilane at a flow rate in a range from about 100 sccm to about 1000 sccm;

flowing the trichlorosilane at a flow rate in a range from about 7000 sccm to about 10000 sccm; and flowing the antimony-containing precursor at a flow rate in a range from about 0.1 sccm to about 100 sccm.

20. A method of forming a semiconductor device comprising:

forming a multi-material layer on a substrate positioned in a processing region, wherein the multi-material layer includes a plurality of crystalline first layers and a plurality of non-crystalline second layers arranged in an alternating pattern; and selectively forming a source region and a drain region on the crystalline first layers of the substrate, wherein the formed source region and drain region contain an n-type dopant precursor concentration of greater than about $1\times10^{21}$ atoms/$cm^3$, the forming the source region and the drain region further comprising:

flowing a first chlorosilane precursor gas selected from dichlorosilane and trichlorosilane;

co-flowing a higher order chlorosilane precursor gas having a formula $Cl_ySi_xH_{(2X+2-y)}$, wherein y is 3 or more and x is one or more and the higher order chlorosilane precursor gas is different from the first chlorosilane precursor gas;

co-flowing an n-type dopant precursor gas with the first chlorosilane precursor gas and the higher order chlorosilane precursor gas; and heating the substrate to a temperature of about 550° C. or less, wherein a flow rate of the higher order chlorosilane precursor gas to a flow rate of the first chlorosilane precursor gas is 10:1 or greater.

* * * * *